United States Patent
Lee et al.

(10) Patent No.: US 9,117,515 B2
(45) Date of Patent: Aug. 25, 2015

(54) PROGRAMMABLE METALLIZATION CELL WITH TWO DIELECTRIC LAYERS

(75) Inventors: Feng-Ming Lee, Changhua (TW); Yu-Yu Lin, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 425 days.

(21) Appl. No.: 13/352,946

(22) Filed: Jan. 18, 2012

(65) Prior Publication Data

US 2013/0182487 A1     Jul. 18, 2013

(51) Int. Cl.
| | | |
|---|---|---|
| G11C 11/00 | (2006.01) | |
| G11C 13/00 | (2006.01) | |
| H01L 45/00 | (2006.01) | |
| H01L 27/24 | (2006.01) | |
| G11C 8/10 | (2006.01) | |

(52) U.S. Cl.
CPC ........ *G11C 13/0011* (2013.01); *H01L 27/2463* (2013.01); *H01L 45/085* (2013.01); *H01L 45/1233* (2013.01); *H01L 45/144* (2013.01); *H01L 45/1608* (2013.01); *H01L 45/1675* (2013.01); *G11C 8/10* (2013.01); *G11C 2213/54* (2013.01); *G11C 2213/71* (2013.01)

(58) Field of Classification Search
USPC ........................................................ 365/148
See application file for complete search history.

(56) References Cited

U.S. PATENT DOCUMENTS

| | | | |
|---|---|---|---|
| 6,849,905 B2 | 2/2005 | Ilkbahar et al. | |
| 7,071,021 B2 * | 7/2006 | Harshfield et al. | 438/95 |
| 7,236,394 B2 | 6/2007 | Chen et al. | |
| 8,134,139 B2 | 3/2012 | Lin et al. | |
| 8,426,839 B1 * | 4/2013 | Ma et al. | 257/4 |
| 8,605,495 B2 | 12/2013 | Lung | |
| 2004/0238958 A1 * | 12/2004 | Moore et al. | 257/751 |
| 2006/0054823 A1 * | 3/2006 | Yon et al. | 250/338.4 |

(Continued)

OTHER PUBLICATIONS

U.S. Appl. No. 13/103,887, filed May 9, 2011 entitled "Isolation Device Free Memory" (MXIC 1968-1).

(Continued)

*Primary Examiner* — Huan Hoang
*Assistant Examiner* — Pablo Huerta
(74) *Attorney, Agent, or Firm* — Haynes Beffel & Wolfeld LLP (57) ABSTRACT

A programmable metallization device comprises a first electrode and a second electrode, and a first dielectric layer, a second dielectric layer, and an ion-supplying layer in series between the first and second electrodes. In operation, a conductive bridge is formed or destructed in the first dielectric layer to represent a data value. During read, a read bias is applied that sufficient to cause formation of a transient bridge in the second dielectric layer, and make a conductive path through the cell if the bridge is present in the first dielectric layer. If the bridge is not present in the first dielectric layer during the read, then the conductive path is not formed. Upon removal of the read bias voltage any the conductive bridge formed in the second dielectric layer is destructed while the conductive bridge in the corresponding other first dielectric layer, if any, remains.

17 Claims, 8 Drawing Sheets

(56) References Cited

U.S. PATENT DOCUMENTS

| | | |
|---|---|---|
| 2006/0097341 A1 | 5/2006 | Pellizzer et al. |
| 2009/0290266 A1* | 11/2009 | Dieny et al. .................... 360/314 |
| 2009/0290407 A1* | 11/2009 | Mouli ............................ 365/158 |
| 2010/0059808 A1 | 3/2010 | Zheng et al. |
| 2011/0001115 A1 | 1/2011 | Greene et al. |
| 2011/0180775 A1* | 7/2011 | Lin et al. ............................ 257/4 |
| 2012/0044746 A1 | 2/2012 | Chung |
| 2012/0091420 A1* | 4/2012 | Kusai et al. ........................ 257/4 |
| 2012/0188813 A1 | 7/2012 | Chien et al. |
| 2013/0182487 A1* | 7/2013 | Lee et al. ...................... 365/148 |
| 2014/0112058 A1* | 4/2014 | Kellam et al. ................. 365/148 |
| 2014/0131653 A1* | 5/2014 | Lee et al. ........................... 257/4 |
| 2014/0268998 A1* | 9/2014 | Jo ................................. 365/148 |

OTHER PUBLICATIONS

Li F., et al., "Evaluation of SiO2 Antifuse ina 3D-OTP Memory," IEEE Transaction on Device and Materials Reliability, vol. 4, No. 3, 2004, pp. 416-421.

Sasago Y., et al., "Cross-point phase change memory with 4F2 cell size driven by low-contact-resistivity poly-Si diode," 2009 Symposium on VLSI Technology Digest of Tech. Papers, pp. 24-25.

Kau Dc, et al., "A stackable cross point phase change memory," 2009 International Electron Devices Meeting, Baltimore MD, pp. 27.1.1-27.1.4.

Chen, Y-C. et al., "An Access-Transistor-Free (0T/1R) Non-Volatile Resistance Random Access Memory (RRAM) Using a Novel Threshold Switching, Self-Rectifying Chalcogenide Device," IEDM 2003, pp. 37.4.1-37.4.4.

* cited by examiner

PROGRAMMABLE METALLIZATION CELL WITH TWO DIELECTRIC LAYERS

BACKGROUND OF THE INVENTION

1. Field of the Invention

The present invention relates to programmable metallization cell (PMC) technology.

2. Description of Related Art

Programmable Metallization Cell (PMC) technology is being investigated for use in nonvolatile memory, reconfigurable logic, and other switching applications due to its low current, good scalability, and high programming speed. The resistance switching of PMC devices is manifested by growing and removing conducting bridges through an electrochemical or electrolytic process. Therefore, PMC devices have also been referred to as conducting bridge (CB) devices or electrochemical (EC) devices.

PMC devices have an ON state in which the conductive bridge completes a current path between electrodes, and an OFF state in which the conductive bridge is reduced such that it does not complete a current path between the electrodes. When arranged in a memory array, underlying transistors, diodes and other access devices are required to prevent current flow from unselected cells in the ON state from interfering with read operations, and other operations on selected cells.

Many three-dimensional (3D) memory concepts have been proposed in order to make high density memory. Li et al., "Evaluation of SiO2 Antifuse in a 3D-OTP Memory," IEEE TRANSACTIONS ON DEVICE AND MATERIALS RELIABILITY, VOL. 4, NO. 3, Sep. 2004, describes a polysilicon diode and an anti-fuse arranged as a memory cell. Sasago et al., "Cross-point phase change memory with $4F^2$ cell size driven by low-contact-resistivity poly-Si diode," 2009 Symposium on VLSI Technology Digest of Technical Papers, pages 24-25, describes a polysilicon diode and a phase change element arranged as a memory cell. Kau et al., "A stackable cross point phase change memory," IEDM09-617, (2009) pages 27.1.1 to 27.1.4, describes a memory cell including an ovonic threshold switch OTS as an isolation device with a phase change element. These technologies rely on a combination of an isolation device and a memory element to construct the memory cell. The isolation device adds extra processes and thickness and/or area to the memory structure. Also, the isolation device/memory element approach is not suitable for many 3D memory structures, including so called Bit Cost Scalable BiCS structures and other 3D memory structures that include a large number of memory layers.

In Chen et al., "An Access-Transistor-Free (0T/1R) Non-Volatile Resistance Random Access Memory (RRAM) Using a Novel Threshold Switching, Self-Rectifying Chalcogenide Device," IEDM 03-905, (2003), pages 37.4.1 to 37.4.4, a so-called zero transistor/one resistor 0T/1R memory cell is described using a phase change element that does not include a separate isolation device. (See, also, U.S. Pat. No. 7,236,394).

Therefore, it is desirable to provide a memory technology that is suitable for high density structures such as in so-called 0T/1R arrays, and is easily manufactured.

SUMMARY OF THE INVENTION

A memory device comprises a first electrode, a PMC memory structure and a second electrode. The PMC memory structure has a first condition in which a conductive bridge, if any, does not extend from the first electrode to a first intermediate distance between the electrodes, a second condition in which a conductive bridge extends from the first electrode to the intermediate distance between the electrodes, and a third condition in which a conductive bridge extends from the first electrode to the second electrode. The memory structure can comprise a first dielectric layer electrically coupled to the first electrode and adapted for electrolytic formation and destruction of a conducting bridge therethrough and a second dielectric layer in electrical communication with the first dielectric layer adapted for electrolytic formation and destruction of a conductive bridge therethrough. The intermediate distance can correspond to the distance from the first electrode to an interface between the first and second dielectric layers. An ion-supplying layer is between the second dielectric layer and the second electrode, and optionally an additional, intermediate ion-supplying layer is at the interface between the first and second dielectric layers. The ion-supplying layer or layers comprise a source or sources of ions of an element capable of diffusion into and out of the first and second dielectric layers supporting the formation and destruction of the conductive bridges needed to establish the first, second and third conditions. The memory structure is characterized further by a first bias condition, including a threshold voltage or current, required to transform the memory structure from the first to the third conditions, and a second bias condition including a threshold voltage or current, required to transform the memory structure from the second to the third condition.

Memory devices of this type can be arranged in an array, and circuitry can be coupled to the array to apply bias voltages to the first and second electrodes to set the memory structure in the first condition to represent a first data value, and to set the memory structure in the second condition to represent a second data value. To sense the data value, a read bias condition is applied inducing a voltage or current level between the thresholds for the first and second conditions. Thus a read bias is sufficient to change a cell in the second condition to the third condition, but insufficient to change a cell in the first condition to the third condition.

The array can take the form of a cross-point array, with memory cells formed at interfaces in the cross-points of a plurality of word lines and a plurality of bit lines. The array can comprise a plurality of two-dimensional cross-point arrays stacked in a three-dimensional array.

Other aspects and advantages of the present invention can be seen on review of the drawings, the detailed description, and the claims which follow.

DETAILED DESCRIPTION

A detailed description of embodiments of the present invention is provided with reference to the FIGS. 1-11.

Figure 1:
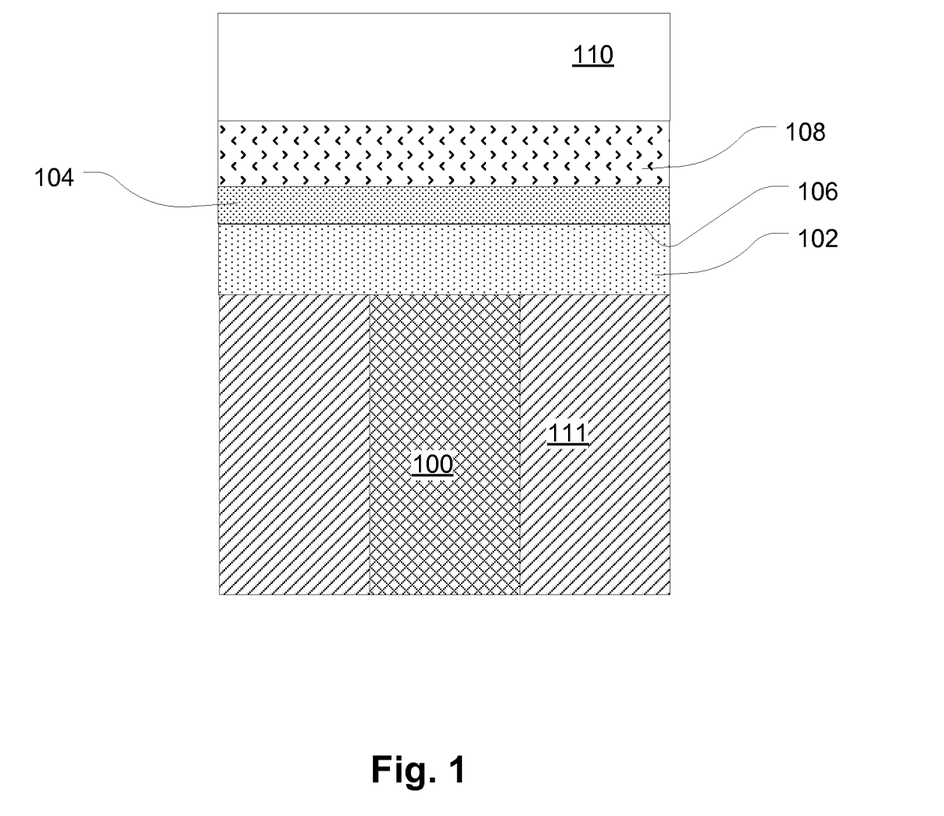
FIG. 1 is a cross-sectional view of a PMC cell including two dielectric layers.

FIG. 1 illustrates a cross-sectional view of a PMC cell including two dielectric layers. The PMC cell includes a first electrode 100, which in this example comprises a plug within a via through an interlayer dielectric 111. The cell includes a first dielectric layer 102 overlying and contacting the first electrode 100. A second dielectric layer 104 overlies the first dielectric layer 102, with an interface 106 at an intermediate distance between the first and second electrodes 100 and 110. The dielectric layers 102 and 104 can be comprised of any dielectric material that is suitable for allowing the diffusion of conductive ions through the layer, and formation of a conductive bridge through the PMC cell. Such dielectric layers can be silicon dioxide, silicon nitride, silicon oxynitride and other materials that can support electrolytic formation and destruction of conducting bridges therethrough. The dielectric layers 102 and 104 can be of different materials that are adapted for different diffusion rates of metal ions through such layers. Also, the second dielectric layer 104 can be thinner than the first dielectric layer 102.

An ion-supplying layer 108 overlies the second dielectric layer 104 to provide a source of ions for formation of the conductive bridge through the first and second dielectric layers 102 and 104. The ion-supplying layer 108 can be comprised of a chalcogenide layer, such as $Ge_2Se_2Te_5$, that also includes metal ions such as copper. The copper can react with the tellurium in the chalcogenide to form a Cu—Te compound. Such Cu—Te can readily dissolve to release copper ions that can diffuse into the first and second dielectric layers 102 and 104, thereby leading to the formation of a conductive bridge within the memory cell.

A second electrode 110 overlies the ion-supplying layer 108. The second electrode 110 can consist of a patterned copper metallization element or any other metallization technology compatible with the adjacent layers.

A bias condition having a first polarity can be applied across the PMC cell between the first electrode 100 and the second electrode 110, that causes the ions supplied by the ion-supplying layer 108 to migrate into the first and second dielectric layers 102 and 104, and create a conductive bridge through a process like electro-deposition. The conductive bridge can grow sufficiently to connect the first electrode 100 to the ion-supplying layer 108 such that the conductive bridge extends through both the first and second dielectric layers 102 and 104. Such conductive bridge creates the third condition mentioned above, establishing a conductive state within the PMC cell. Changing the bias condition across the PMC, including changing to a neutral bias in some embodiments, can stop the formation of a conductive bridge through the PMC cell and leads to the dissolution of the conductive bridge until it extends only to the intermediate distance between the first and second electrodes, at the interface 106 in this example. The bridge still remains within the first dielectric layer 102, establishing the second condition mentioned above. In the second condition, the memory cell has a high resistance. Applying a bias condition having a second polarity can cause the conductive bridge extending the intermediate distance from the first electrode 100 to dissolve further, or completely, establishing the first condition mentioned above. In the first condition, the memory cell has a high resistance. The bias condition needed to establish the third condition has a first threshold for changing a cell from the second to the third condition and a second threshold, higher than the first threshold, for changing the cell from the first to the third condition. In the third condition, the memory cell has a low resistance. This difference in thresholds is applied for reading the data from the memory cell.

In alternate embodiments, the memory structure can be arranged for storing more than one bit per cell, by formation of bridges to more than one intermediate distance between the electrodes, with corresponding threshold levels for transition to the low resistance, third condition.

Figure 2:
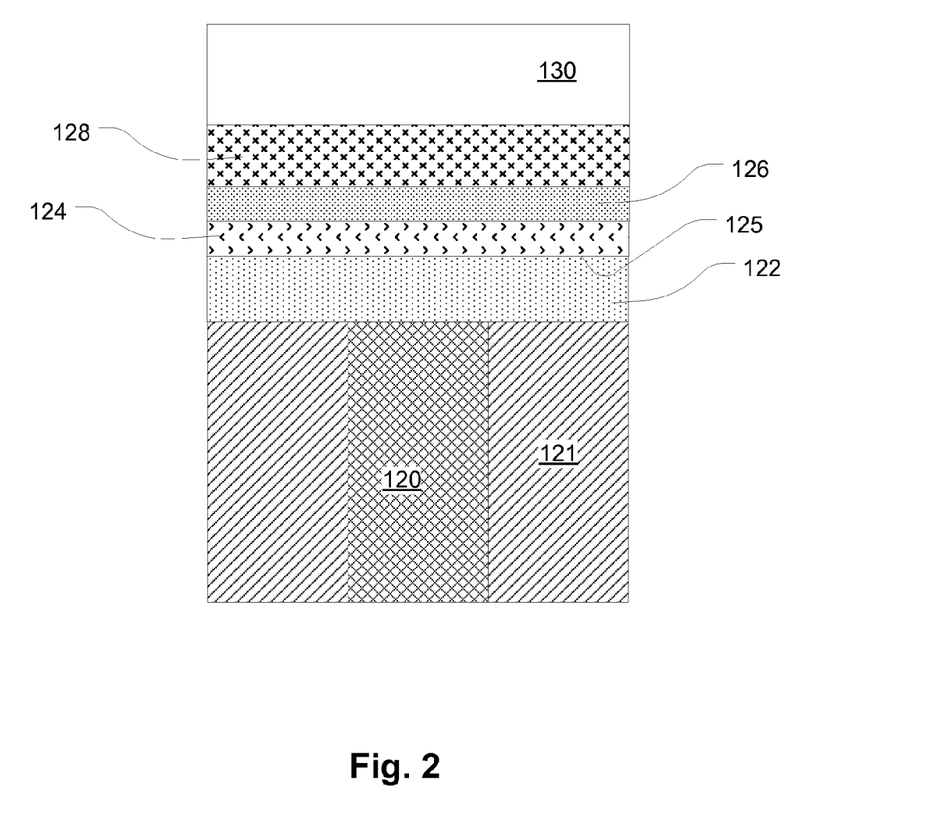
FIG. 2 is a cross-sectional view of an alternate configuration of a PMC cell that includes two dielectric layers and an intermediate ion-supplying layer.

FIG. 2 illustrates a cross-sectional view of an alternate configuration of a PMC cell with two dielectric layers that includes an intermediate ion-supplying layer 124 at the intermediate distance between the first and second electrodes. As with the previous configuration, the PMC cell can includes a first electrode 120 extending through an interlayer dielectric 121. A first dielectric layer 122 contacts the first electrode 120. A second dielectric layer 126 overlies the intermediate ion-supplying layer 124, such that the intermediate ion-supplying layer 124 is at the interface 125 between the first and second dielectric layers 122 and 126. The first and second dielectric layers 122 and 126 can be of any dielectric material that is suitable for allowing the diffusion of metal ions through such layers. Specifically, the first and second dielectric layers 122 and 126 can be comprised of silicon dioxide. Additionally, the first and second dielectric layers 122 and 126 can be comprised of different materials that create differing diffusion rates of metal ions through such layers.

The PMC cell shown in FIG. 2 includes a first ion-supplying layer 128 that overlies the second dielectric layer 126. The first ion-supplying layer 128 can be comprised of a previously described chalcogenide layer, such as $Ge_2Se_2Te_5$, that also includes a source of metal ions such as Copper that can lead to the formation of a conductive bridge within the memory cell. In this embodiment, an intermediate ion-supplying layer 124 is disposed between the first dielectric layer 122 and the second dielectric layer 126.

The intermediate ion-supplying layer 124 can be comprised of any material that is suitable for forming metal ions that can diffuse into the first and second dielectric layers 122 and 126. The intermediate ion-supplying layer 124 can be comprised of a chalcogenide layer, such as $Ge_2Se_2Te_5$, that also includes a source of metal ions such as Copper. The Copper can react with the Tellurium in the chalcogenide to form a Cu—Te compound. Such Cu—Te can readily dissolve to release Copper ions that can diffuse into the first and second dielectric layers 122 and 126, thereby leading to the formation of a conductive bridge within the memory cell. Additionally, the intermediate ion-supplying layer 124 can be comprised of a metal that is capable of forming metal ions during application of an applied current that can diffuse into the first and second dielectric layers 122 and 126. In particular, the second-ion-supplying layer can be comprised of a refractory metal.

The memory cell also includes a second electrode 130 that contacts the cell at the first ion-supplying layer 128. The second electrode 130 can be of any suitable conductive material that is capable of conducting current to create a bias across the memory cell.

The PMC cell configuration shown in FIG. 2 operates as described above in connection with the configuration of FIG. 1. The addition of the intermediate ion-supplying layer 124 facilitates rapid formation and dissolution of the bridge across the second dielectric layer for transition between the second and third conditions described above. Also, the intermediate ion-supplying layer 124 can facilitate rapid formation and dissolution of the bridge across the first dielectric layer for transition between the first and third, or first and second, conditions described above.

Figure 3A:
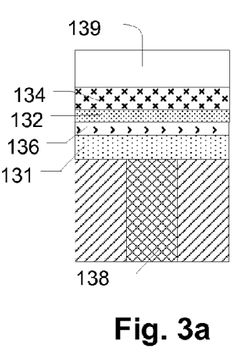
FIGS. 3a-3c illustrate a set operation for a PMC cell like that shown in FIG. 2.
Figure 3B:
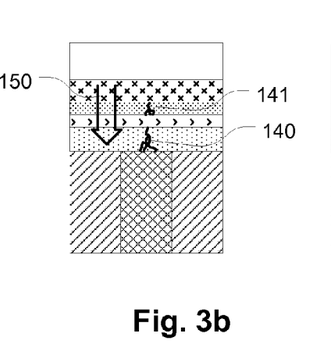
Figure 3C:
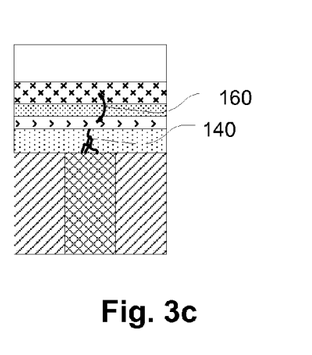

FIGS. 3a-3c illustrate a sequence of stages or conditions of a memory cell of the configuration shown in FIG. 2 traversed during a "set" operation of the cell to establish the second condition in a cell initially in the first condition. FIG. 3a illustrates the PMC cell in a high resistance, first condition, before a conductive bridge is formed. The first condition corresponds with a first data value for the cell. As with the PMC cell configuration shown in FIG. 2, the PMC cell includes first and second dielectric layers 131 and 132. The first dielectric layer overlies and makes electrical contact with a first electrode 138. A first ion-supplying layer 134 overlies the second dielectric layer 132. The intermediate ion-supplying layer 136 is disposed between the first and second dielectric layers 131 and 132. A second electrode 139 overlies and makes electrical contact with the first ion-supplying layer 134. The cell shown in FIG. 3a is in the first condition in which a conductive bridge is not present, through either of the first and second dielectric layers 131 and 132 within the cell.

FIG. 3b illustrates the cell during application of a set bias condition, represented by arrow 150, having a first polarity in the "set" operation, to change the cell from the first condition of FIG. 3a to a conductive third condition. Application of a bias voltage between the first and second electrodes 138 and 139 leads to the formation of a conductive bridge 140 across the first dielectric layer 131, and a conductive bridge across the second dielectric layer 132. In operation, the conductive bridges 140, 141 are formed by the migration of metal ions into the first and second dielectric layers 131 and 132 in a process like electrochemical or electrolytic deposition. The conductive bridges grow sufficiently such that the conductive bridge 140 in the first dielectric layer 131 contacts the intermediate ion-supplying layer 136 and the conductive bridge 141 in the second dielectric layer 132 contacts the first ion-supplying layer 134. As a result, the cell assumes the third condition, which is a low resistance state.

FIG. 3c illustrates the cell after the set bias condition that is applied during the set operation is changed to a neutral bias condition. In the neutral bias condition, the ions that form the conductive bridge 141 in the second dielectric layer 132 migrate out of such layer as represented by arrow 160 into the first or intermediate ion-supplying layers, thereby destructing the conductive bridge 141. As a result, the conductive bridge 141 can be characterized as temporary or transient. While the ions migrate out of one of the first or second dielectric layers 131 and 132, the ions do not migrate out of the first dielectric layer 131. The second dielectric layer 132 can have a higher solubility of the metal ions, and be thinner than, the first dielectric layer 131. Also, the second dielectric layer is contacted on both sides by ion-supplying layers, in this example. These characteristics facilitate the rapid dissolution of the bridge 141 under a neutral or low bias condition. After the bridge 141 is destructed, bridge 140 remains in the first dielectric layer. As a result, the cell as shown in FIG. 3c is in the high resistance second condition, which corresponds to a second data value for the cell.

Figure 4A:
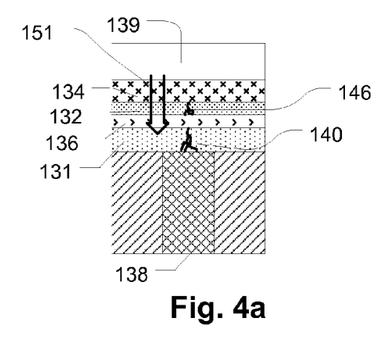
FIGS. 4a-4b illustrate read operation for a PMC cell like that shown in FIG. 2, starting in the set and reset conditions, respectively.
Figure 4B:
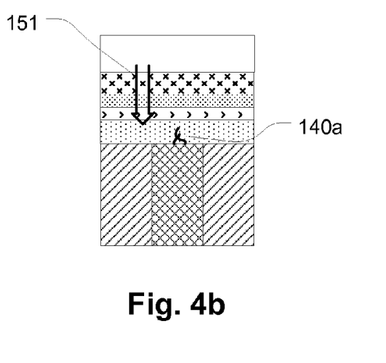

FIGS. 4a and 4b illustrate operation during application of a read bias condition, represented by arrow 151. FIG. 4a shows a cell initially in the second condition (or set condition), as shown in FIG. 3c, during a read operation. FIG. 4b shows a cell initially in the first condition (or reset condition), as shown in FIG. 3a, during a read operation.

FIG. 4a illustrates that under read bias 151, for the cell starting in the second condition with a bridge 140 in layer 131, a temporary filament 146 is formed within layer 132, such that the memory cell is transformed into the conductive third condition. After removal of the read bias, the filament destructs in the manner described with reference to FIG. 3c.

FIG. 4b illustrates that under read bias 151, for the cell starting in the first condition without a bridge in layer 131, any filament (e.g. 140a) formed in the first dielectric layer 131 does not complete the connection to the interface with layer 136, and even if a temporary filament (not shown) is formed within layer 132, the memory cell remains in a high resistance condition. Also, any filaments formed during the read operation are destructed, at least substantially destructed, upon removal of the read bias.

Therefore, during a read operation, a sense amplifier can detect the presence or absence of current to determine whether the cell started in the set condition, or reset condition, respectively.

Figure 5:
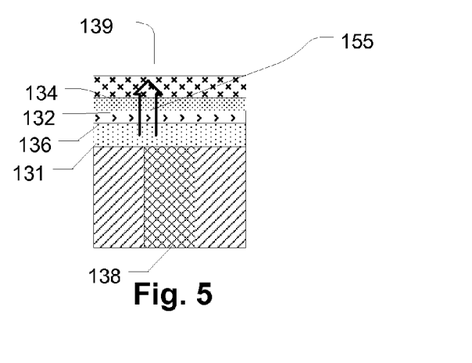
FIG. 5 illustrates a reset operation for a PMC cell like that shown in FIG. 2.

FIG. 5 illustrates a cell during a reset operation in which a reverse polarity bias condition is applied, as represented by arrow 155, to cause any conductive bridges to change a cell in the second condition representing the second data value to destruct, resulting in establishing the cell in the first condition, representing the first data value. After the reset bias condition is removed, the cell will remain in the high resistance first condition.

Figure 6:
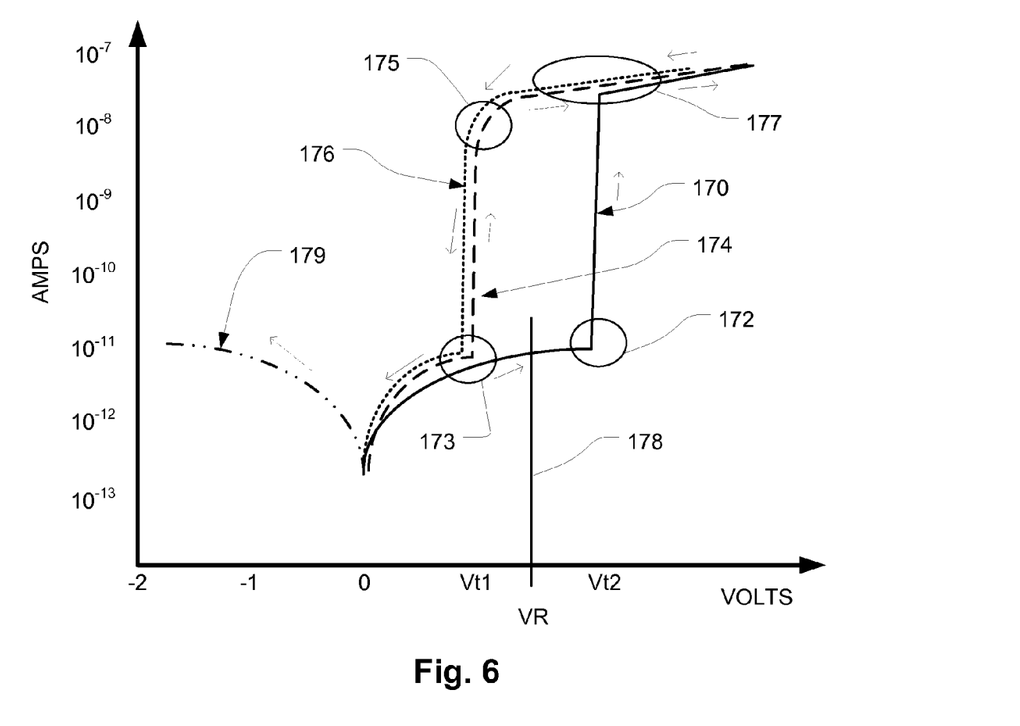
FIG. 6 is a graph of the current as a function of the voltage applied across a PMC cell with two dielectric layers, as such cell exists in various resistive states corresponding to various configurations of the conductive bridges across the first and second dielectric layers.

FIG. 6 is a graph of the current as a function of the voltage (I-V characteristic) applied across a PMC cell, like the cell shown in FIG. 2. Line 170 represents the current voltage characteristics of a cell that starts in the high resistance, first condition such as represented by FIG. 3a, as a bias condition is applied including a positive voltage at the top electrode and ground at the bottom electrode. As the voltage increases, the current through the cell remains very low until a threshold $V_{t2}$ at point 172 is reached. When the threshold $V_{t2}$ is applied to the cell, a conductive bridge is formed within both first and second dielectric layers, thereby achieving a conductive second condition (set) within the cell as represented by the region 177 in FIG. 6. At the threshold, the current within the cell increases by about three orders of magnitude in this example.

For a cell starting in the second condition, with a conductive bridge in the first dielectric layer but not the second, the I-V characteristic for increasing voltage is shown on trace 174. As the voltage increases, the current through the cell remains very low until a threshold $V_{t1}$ at point 173 is reached. When the threshold $V_{t1}$ is applied to the cell, a conductive bridge is formed in the second dielectric layer, thereby achieving a conductive condition starting in area 175 of the graph.

As the voltage is reduced for a cell in the conductive third condition represented by region 177, the current falls along trace 176, until about area 175, corresponding to loss of the conductive bridge in the second dielectric layer, as represented by FIG. 3c. At area 175, the current again drops to a very low level, setting the cell in the high resistance second condition in which a bridge remains in the first dielectric layer but not the second.

To return a cell starting in the high resistance second condition to the high resistance first condition, a bias having an opposite polarity is applied, as represented by trace 179. As the negative voltage increases, the conductive bridge in the first dielectric layer is destructed, and the cell is reset to the first high resistance state, as represented by FIG. 5.

FIG. 6 also shows a read bias level VR at point 178, between Vt1 and Vt2. In a read operation, as illustrated by FIGS. 4a and 4b, a read bias condition (arrow 151 in FIGS. 4a and 4b) is applied causing a voltage of about VR across the cell. This level is sufficient to cause a cell in the second condition to transition to a conductive state along trace 174, but not sufficient to cause a cell in the first condition to transition to a conductive state along line 170. Thus, the condition of the cell can be sensed to indicate data. Also, both the first and second conditions used to indicate data values are high resistance conditions under neutral or low bias conditions, allowing operation without active access devices.

Figure 7:
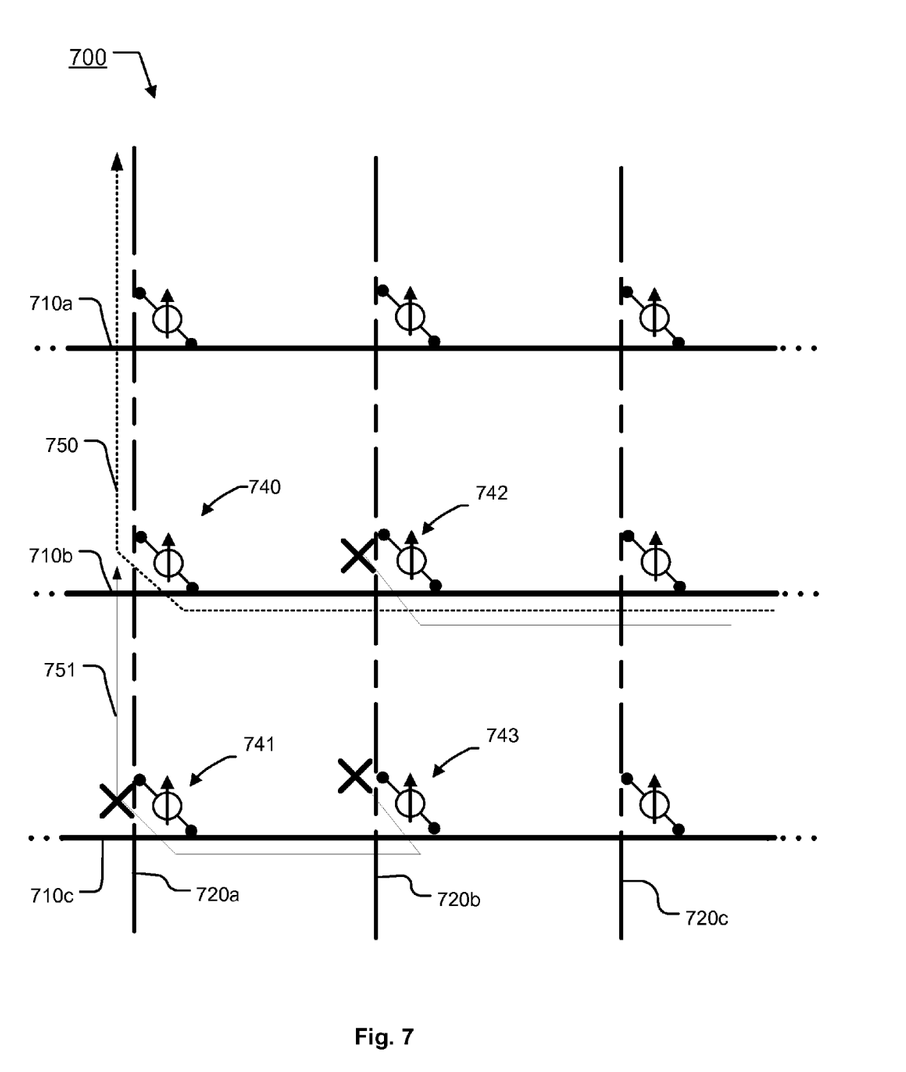
FIG. 7 is a circuit diagram of the configuration of PMC cells within a 1R cross-point planar array structure.

FIG. 7 is a schematic diagram of a cross-point memory array implemented using a "1R" memory cell, without a transistor or other active access device for the cell, as described herein. As shown in FIG. 7, each of the memory cells of the array 700 is represented by a resistive memory element along a current path between a corresponding word line 710a-710c and a corresponding bit line 720a-720c.

The array comprises a plurality of word lines 710a, 710b, and 710c extending in parallel in a first direction, and a plurality of bit lines 720a, 720b, and 720c extending in parallel in a second direction perpendicular to the first direction. The array 700 is referred to as a cross-point array because the word lines 710a-710c and bit lines 720a-720c cross each other but do not physically intersect, and the memory cells are located at these cross-points.

Memory cell 740 is representative of the memory cells of array 700 and is arranged at the cross-point location of the word line 710b and the bit line 720b. The memory cell 740 is passively coupled to the word line 710b and passively coupled to the bit line 720b.

Reading or writing the memory cell 740 of array 700 can be achieved by applying appropriate voltage pulses to the corresponding word line 710b and bit line 720a to cause a set, reset or read bias condition at the selected memory cell 740, while applying appropriate inhibit voltages to the unselected word lines and bit lines. The level and duration of the voltages applied is dependent upon the operation performed, e.g. a reading operation or a programming operation. A current path 750 is formed to a selected cell (e.g. cell 740) as illustrated. Leakage current through other cells in the array, such as represented by leakage current path 751, is blocked as represented by the "X", because the cells in both the set and reset conditions (first and second conditions) have high resistance and block current flow under the bias conditions that result on unselected cells. Thus, the bias voltage caused by the combination of the voltage on selected bit line 720a and the voltage on unselected word line 710c are insufficient for current flow through unselected cell 741 along line 751 back to the selected bit line 720a. Also, the bias voltage caused by a combination of the voltage on the selected word line 710b and an unselected bit line 720b are insufficient for current flow through unselected cell 742. Finally, the combination of voltages on unselected word line 710c and unselected bit line 720b is insufficient for current flow through unselected cell 743.

In one example, during the read and first and second reset bias arrangements, a full voltage V (e.g. VR for a read) of the corresponding pulse, is applied to the selected word line (e.g. word line 710b), while one half voltage V/2 of the corresponding pulse is applied to the unselected word lines (e.g. word lines 710a and 710c). Also, a zero voltage is applied to the selected bit line (e.g. 720b), while a half voltage V/2 of the corresponding pulse is applied to the unselected bit lines (e.g. bit lines 720a and 720c). This results in the selected cell 740 receiving the full pulse height V, while the unselected cells are biased at V/2. In this case, V/2 should be lower than the level Vt1 of FIG. 6.

In another example, during the read and first and second reset bias arrangements, a full voltage V (e.g. VR for a read) of the corresponding pulse is applied to the selected word line (e.g. word line 710b), while one third voltage V/3 of the corresponding pulse is applied to the unselected word lines (e.g. word lines 710a and 710c). Also, a zero voltage is applied to the selected bit line (e.g. 720b), while a two thirds voltage 2V/3 of the corresponding pulse is applied to the unselected bit lines (e.g. bit lines 720a and 720c). This results in the selected cell 740 receiving the full pulse height V, while the unselected cells that do not lie on the selected word line or selected bit line receive a bias of +V/3, while the unselected cells that share either the selected word line or the selected bit line receive a bias of −V/3. In this condition, the −V/3 level should be low enough to prevent reset, or otherwise prevent disturbance of the conductive bridge in cells having the set, second condition.

Similar bias arrangements can be applied to the 3D configurations of the memory device.

Figure 8:
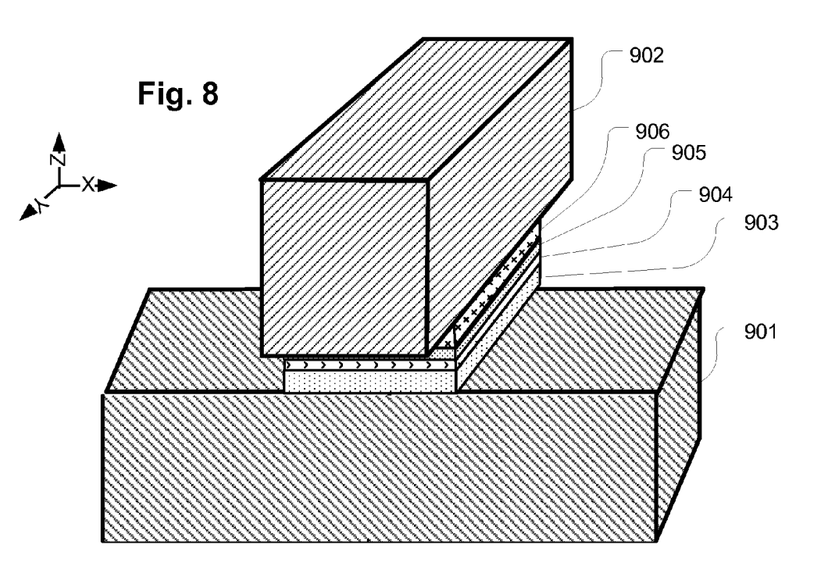
FIG. 8 is a perspective view of a PMC as described herein, arranged for implementation in a cross-point array.

FIG. 8 is a perspective view of a single cross-point memory cell, such as that described above, which can be implemented in a cross-point array. The cross-point array is characterized by a first access line 901, such as a word line, and a second access line 902, such as a bit line, which overlies and is typically orthogonal to the first access line 901. A memory cell is formed at the cross-point, which includes a four layer structure as illustrated in FIG. 2. The layers include a first dielectric layer 903, an ion source layer 904, a second dielectric layer 905, and another ion source layer 906. The first dielectric layer 903 and the top ion source layer 906 of the cross-point cell are passively coupled to the access lines. As used herein, a first element is "passively coupled" to a second element, when there is an electric current flow communication between the first and second element without an intervening rectifying or switching device such as a transistor, a diode or and ovonic threshold switch.

Figure 9:
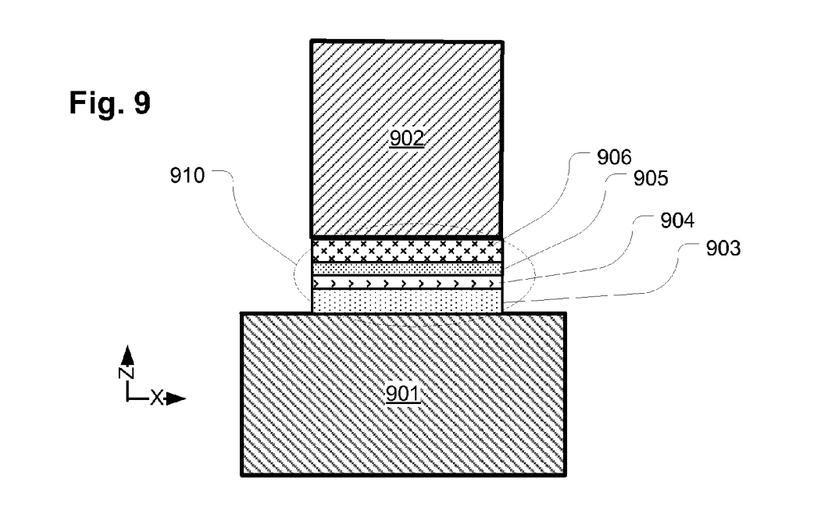
FIG. 9 is a cross-sectional view of the cell shown in FIG. 8.

FIG. 9 is a cross-section view in the X-Z plane of the structure of FIG. 8. As discussed above, the memory cell 910 includes the four layer structure comprising a first dielectric layer 903, an ion source layer 904, a second dielectric layer 905, and another ion source layer 906.

An array implemented using cross-point cells in the configuration of FIGS. 8 and 9 can have many layers, and many bit lines and word lines in each layer for formation of very high density memory devices. Other 3D configurations can be implemented, including a three-dimensional array in which the plurality of word lines and the plurality of bit lines are arranged for access to multiple levels of memory cells.

Figure 10:
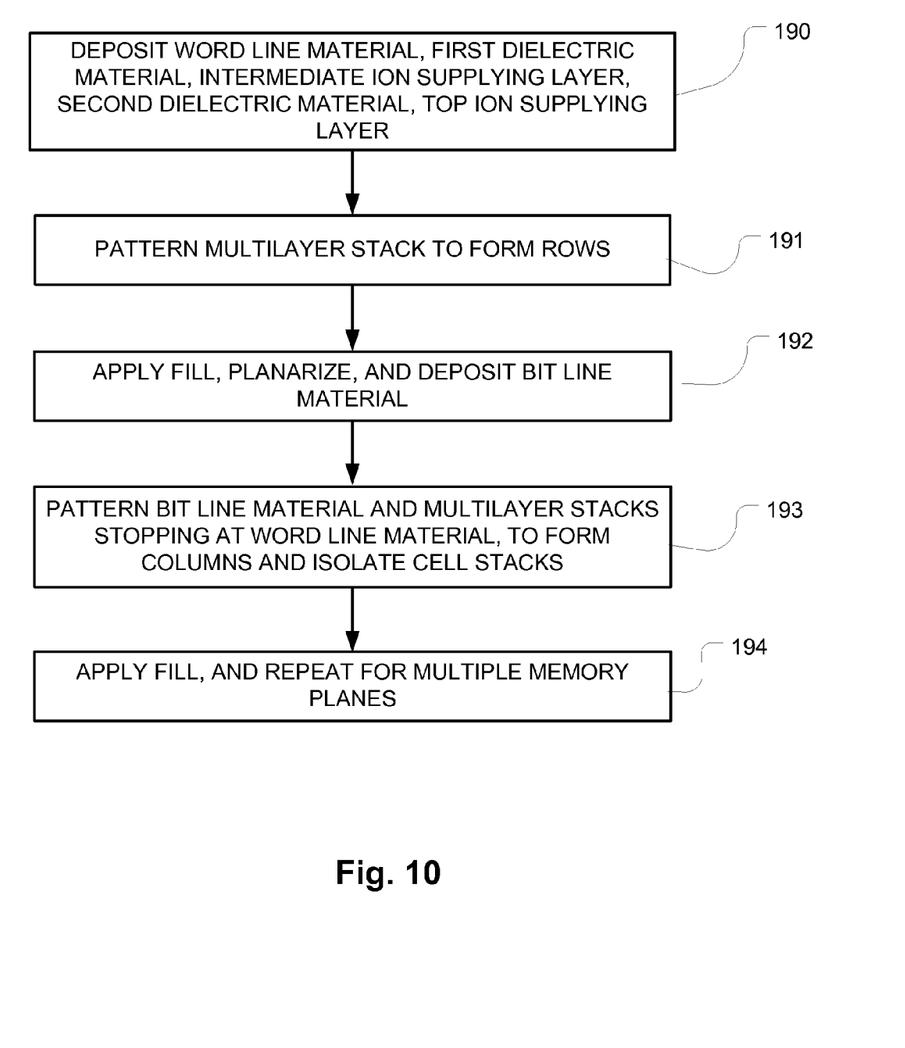
FIG. 10 shows a process flow chart of manufacturing of a PMC cell of the configuration shown in FIG. 2.

FIG. 10 shows a simplified process flow chart of the manufacturing of a PMC cell of the configuration shown in FIG. 2. In this example, a word line serves as bottom electrodes for a plurality of cells along a word line row. Thus, the process involves depositing a layer of word line material, a first dielectric material, an intermediate ion-supplying layer, a second dielectric material, and a top ion-supplying layer, such as described above with reference to FIG. 2 (190). Next, the multilayer stack is patterned to form rows (191). A fill material is applied and planarized, and then a bit line material is deposited over the structure (192). In a next step, the bit line material in the multilayer stacks is patterned, with a pattern etch stopping at the level of the word line material (193). This results in the formation of bit lines coupled to columns of memory cells, and to isolated cell stacks at the cross-points of the word lines and bit lines. Finally, a fill material is applied to complete a memory plane, and the process is repeated to form multiple planes of memory cells (194).

This process provides an embodiment of a technique for forming a plurality of bottom electrodes, forming the memory cell stacks which comprise at least a first dielectric layer, a second dielectric layer, and an ion-supplying layer in series, and then forming top electrodes. Embodiments of the process, as described above, include the formation of an intermediate ion-supplying layer at the interface between the first dielectric layer and a second dielectric layer.

The second dielectric layer in particular, is characterized by the ability to form temporary conductive bridges or filaments under a read bias condition, which destruct or dissolve when the read bias condition is removed, such as by changing to a neutral bias. In order to achieve this characteristic in the second dielectric layer, it can be formed of a material which has a higher solubility of the metal ions used for formation of the filament or bridge, than does the first dielectric layer. For example, the first and second dielectric layers can be formed of pairs of materials, where one class of pairs can include a first material selected from oxides of hafnium, zirconium, tantalum, titanium or gadolinium, or combinations thereof; and a second material selected from silicon oxides, silicon nitrides and silicon oxynitrides or combinations thereof.

Also, the first and second dielectric layers can be formed of the same material, but with different thicknesses. For example, the first dielectric layer can have a thickness in the range of 3 to 10 nanometers, while the second dielectric layer has a smaller sickness, in the range for example of 1 to 3 nanometers.

Figure 11:
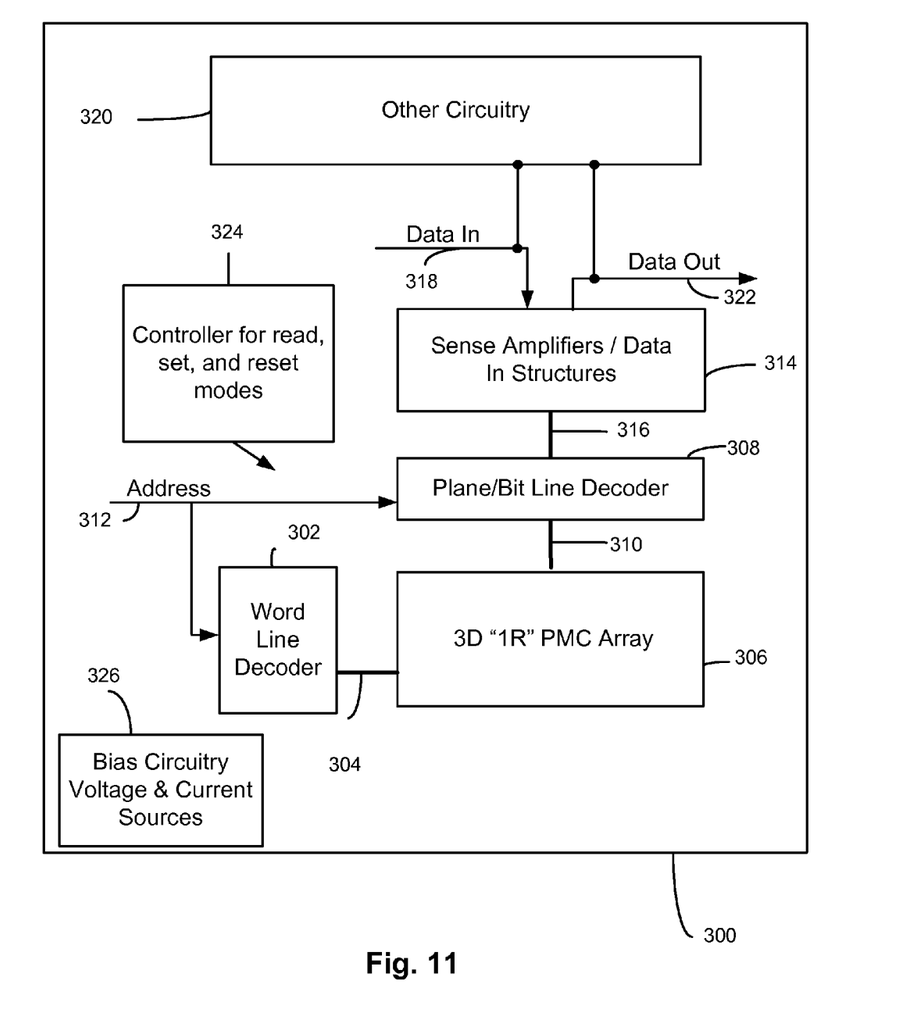
FIG. 11 is a simplified block diagram of an integrated circuit 300 including a memory array implemented using PMC cells as described herein.

FIG. 11 is a simplified block diagram of an integrated circuit 300 including a 3D memory array 306 implemented using an array of "1R" PMC cells with first and second dielectric layers. A word line decoder 302 is coupled to and in electrical communication with a plurality of word lines 304 arranged along rows in the memory array 306. A bit line and plane decoder 308 is in electrical communication with a plurality of bit lines 310 arranged along columns in the array 306 and in a plurality of planes, for reading, setting, and resetting the memory cells in array 306. Addresses are supplied on bus 312 to word line decoder 302 and plane/bit line decoder 308. Sense circuitry (Sense amplifiers) and data-in structures in block 314, are coupled to plane/bit line decoder 308 via data bus 316. Data is supplied via a data-in line 318 from input/output ports on integrated circuit 300, or from other data sources internal or external to integrated circuit 300, to data-in structures in block 314. Other circuitry 320 may be included on integrated circuit 300, such as a general purpose processor or special purpose application circuitry, or a combination of modules providing system-on-a-chip functionality supported by array 306. Data is supplied via a data-out line 322 from the sense amplifiers in block 314 to input/output ports on integrated circuit 300, or to other data destinations internal or external to integrated circuit 300.

The array 306 of memory cells can consist of cells passively coupled to the plurality of bit lines and the plurality of word lines in a cross-point configuration, and in which the memory cells in the array respectively include first and second dielectric layers and an ion-supplying layer in series between corresponding word lines and bit lines.

The integrated circuit 300 includes sense circuitry 314 coupled to the array of memory cells to sense whether a selected memory cell has a threshold below a read threshold, where the application of the threshold bias can cause a transition of the cell to a temporary or transient conductive condition as described above. The control circuitry 324 is coupled to the plurality of bit lines and the plurality of word lines to apply bias arrangements for operation of the memory cells, including:

a read bias arrangement to apply a read threshold to a selected memory cell;

a first write (set) bias arrangement to induce the formation of a bridge in the first dielectric layer of a selected memory cell establishing a first threshold for transition of the selected cell to the temporary conductive condition, the first threshold being below the read threshold; and a second write (reset) bias arrangement to induce destruction of a bridge in the first dielectric layer of a selected memory cell establishing a second threshold for transition of the selected cell to a conductive condition, the second threshold being above the read threshold.

Also, in an embodiment of the memory technology described herein, the array of memory cells comprises a three-dimensional array, and the plurality of word lines and the plurality of bit lines are arranged for access to multiple levels of memory cells in the three-dimensional array.

A controller 324 implemented in this example, using a bias arrangement state machine, controls the application of bias circuitry voltage and current sources 326 for the application of bias arrangements including set, reset and read voltages and/or currents for the word lines and bit lines. Controller 324 may be implemented using special-purpose logic circuitry as known in the art. In alternative embodiments, controller 324 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 324.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising a programmable metallization cell including:
    a first electrode and a second electrode;
    a first dielectric layer, a second dielectric layer, and an ion-supplying layer in series between the first and second electrodes, the ion-supplying layer containing a source of ions which form conductive bridges through the first and second dielectric layers.

2. The memory device of claim 1, wherein the first or second dielectric layers comprise material or materials supporting electrolytic formation and destruction of conducting bridges therethrough.

3. The memory device of claim 1, including circuitry to apply a bias condition to the first and second electrodes to induce creation and destruction of conducting bridges within the first and second dielectric layers.

4. The memory device of claim 1, wherein the first dielectric layer has a first thickness, and the second dielectric layer has a second thickness less than the first thickness.

5. The memory device of claim 1, including a conductive layer at an interface between the first and second dielectric layers.

6. The memory device of claim 1, wherein the ion-supplying layer is located at an interface between the first and second dielectric layers.

7. The memory device of claim 1, wherein the first and second dielectric layers comprise different materials, and the second dielectric layer has a higher solubility for the ions than the first dielectric layer.

8. The memory device of claim 1, wherein the memory device includes a plurality of cells, including said programmable metallization cell, configured in a cross-point array.

9. An integrated circuit, comprising:
a plurality of bit lines and a plurality of word lines; and
an array of memory cells passively coupled to the plurality of bit lines and the plurality of word lines, the memory cells in the array respectively including first and second dielectric layers and an ion-supplying layer in series between corresponding word lines and bit lines, the ion-supplying layer containing a source of ions of a material which form conductive bridges through the first and second dielectric layers.

10. The integrated circuit of claim 9, including:
sense circuitry coupled to the array of memory cells, to sense whether a selected memory cell has a threshold below a read threshold;
control circuitry coupled to the plurality of bit lines and the plurality of word lines to apply bias arrangements for operation of the memory cells, including:
a read bias arrangement to apply a read threshold to a selected memory cell;
a first write bias arrangement to induce the formation of a bridge in the first dielectric layer of a selected memory cell establishing a first threshold for transition of the selected cell to a conductive condition, the first threshold being below the read threshold; and
a second write bias arrangement to induce destruction of a bridge in the first dielectric layer of a selected memory cell establishing a second threshold for transition of the selected cell to a conductive condition, the second threshold being above the read threshold.

11. The integrated circuit of claim 9, wherein the array of memory cells comprises a three-dimensional array, and the plurality of word lines and the plurality of bit lines are arranged for access to multiple levels of memory cells in the three-dimensional array.

12. A method of operating an array of programmable metallization cells, comprising:

in a read mode, applying a read bias arrangement to apply a read threshold to a selected memory cell;
in a first write mode, applying a first write bias arrangement to induce the formation of a bridge in a first dielectric layer of a selected memory cell establishing a first threshold for transition of the selected cell to a conductive condition, the first threshold being below the read threshold; and
in a second write mode, applying a second write bias arrangement to induce destruction of a bridge in the first dielectric layer of a selected memory cell establishing a second threshold for transition of the selected cell to a conductive condition, the second threshold being above the read threshold;
wherein the programmable metallization cells comprise first and second dielectric layers and an ion-supplying layer in series between corresponding word lines and bit lines, and the conductive condition corresponds to conductive bridges, formed from ions supplied from the ion-supplying layer, forming a conductive path that extends through first and second dielectric layers.

13. The method of claim 12, wherein either a first or second high resistance state corresponds to the destruction of a portion of a conductive bridge such that the conductive path extends through only a portion of the cell.

14. A method of manufacturing a device including a programmable metallization memory cell, comprising:
forming a first electrode;
forming a first dielectric layer, a second dielectric layer and an ion-supplying layer in series, such ion-supplying layer containing a source of ions of a conductive bridge material; and
forming a second electrode in contact with the ion-supplying layer;
wherein the first and second dielectric layers comprise a material adapted for electrolytic formation and destruction of a conductive bridge therethrough from ions supplied by the ion-supplying layer.

15. The method for manufacturing of claim 14, wherein the ion-supplying layer is located an interface between the first and second dielectric layers.

16. The method for manufacturing of claim 14, wherein the first and second dielectric layers comprise different materials such that one of either the first or second dielectric layers has a higher solubility for the conductive bridge material than the other first or second dielectric layer.

17. The method for manufacturing of claim 16, further including forming a plurality of memory cells, including said cell, in a cross-point array.

* * * * *